(12) United States Patent
Liu et al.

(10) Patent No.: US 11,726,133 B2
(45) Date of Patent: Aug. 15, 2023

(54) ENERGY STORAGE SYSTEM AND INSULATION DETECTION METHOD THEREFOR

(71) Applicant: Contemporary Amperex Technology Co., Limited, Ningde (CN)

(72) Inventors: Chaoyang Liu, Ningde (CN); Jinfeng Gao, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 47 days.

(21) Appl. No.: 17/434,746

(22) PCT Filed: Feb. 27, 2020

(86) PCT No.: PCT/CN2020/076876
§ 371 (c)(1),
(2) Date: Aug. 28, 2021

(87) PCT Pub. No.: WO2020/173472
PCT Pub. Date: Sep. 3, 2020

(65) Prior Publication Data
US 2022/0128615 A1  Apr. 28, 2022

(30) Foreign Application Priority Data
Feb. 28, 2019  (CN) .......................... 201910148945.0

(51) Int. Cl.
*G01R 31/00* (2006.01)
*G01R 31/14* (2006.01)
*G01R 31/396* (2019.01)

(52) U.S. Cl.
CPC .......... *G01R 31/14* (2013.01); *G01R 31/396* (2019.01)

(58) Field of Classification Search
USPC ................................ 324/503, 510, 551, 557
See application file for complete search history.

(56) References Cited

U.S. PATENT DOCUMENTS

2007/0132457 A1  6/2007 Okamoto et al.
2008/0150549 A1  6/2008 Horikoshi et al.
(Continued)

FOREIGN PATENT DOCUMENTS

CN    102420451 A   4/2012
CN    202190107 U   4/2012
(Continued)

OTHER PUBLICATIONS

Contemporary Amperex Technology Co, Limited, Extended European Search Report, EP20763795.0, dated Mar. 23, 2022, 192 pgs.
(Continued)

*Primary Examiner* — Vincent Q Nguyen
(74) *Attorney, Agent, or Firm* — Anova Law Group, PLLC

(57) ABSTRACT

An insulation detection method includes closing a main positive relay and a main negative relay in a high voltage safety box of each electric cabinet in an energy storage system; controlling an insulation detection board to perform insulation detection at a main power management system, and to report an insulation detection result to a power conversion system; controlling, if the insulation detection result at the main power management system indicates no fault and no instruction of starting insulation detection at the power conversion system is received, the insulation detection board to continue performing the insulation detection; and instructing, if the insulation detection result at the main power management system indicates an insulation fault, a battery management system of each electric cabinet to
(Continued)

control the main positive relay and the main negative relay in the high voltage safety box to turn off.

11 Claims, 7 Drawing Sheets

(56) References Cited

U.S. PATENT DOCUMENTS

| | | | |
|---|---|---|---|
| 2012/0223734 | A1 | 9/2012 | Takada et al. |
| 2013/0021038 | A1* | 1/2013 | Tago .................... B60L 3/0069 324/510 |

FOREIGN PATENT DOCUMENTS

| | | |
|---|---|---|
| CN | 102841259 A | 12/2012 |
| CN | 103354377 A | 10/2013 |
| CN | 104104330 A | 10/2014 |
| CN | 104142475 A | 11/2014 |
| CN | 104578124 A | 4/2015 |
| CN | 105717404 A | 6/2016 |
| CN | 106569137 A | 4/2017 |
| CN | 104142475 B | 8/2017 |
| CN | 206633828 U | 11/2017 |
| CN | 107526041 A | 12/2017 |
| CN | 207114697 U | 3/2018 |
| CN | 108258748 A | 7/2018 |
| CN | 108565509 A | 9/2018 |
| EP | 3451003 A2 | 3/2019 |
| JP | 2006033997 A | 2/2006 |
| KR | 101625154 B1 | 5/2016 |

OTHER PUBLICATIONS

Contemporary Amperex Technology Co , Limited, International Search Report, PCT/CN2020/076876, dated Apr. 27, 2020, 8 pgs.
Contemporary Amperex Technology Co , Limited, CN First Office Action, CN 201910148945.0, dated Dec. 28, 2020, 5 pgs.
Contemporary Amperex Technology Co , Limited, CN Final Office Action, CN 201910148945.0, dated Mar. 19, 2021, 4 pgs.
Shicheng LI, "Study on Power Battery Energy Management System for EV based on CAN Bus," China Master's Theses Full-text Database, Feb. 15, 2017, 112 pgs.
Sheng Tian, "Control Strategy of Power on and Power off of EV and Fault of Battery Management System," Journal of South China Unversity of Technology, Sep. 30, 2016, 10 pgs.
The World Intellectual Property Organization (WIPO) Written Opinion for PCT/CN2020/076876 dated Apr. 27, 2020 7 pages (including translation).
European Patent Office(EPO) Decision to Grant for Application No. 20763795.0 dated Oct. 17, 2022 5 pages.
The China National Intellectual Property Administration (CNIPA) Translation of Notification to Grant for 201910148945.0 dated Mar. 19, 2021 2 Pages.
The China National Intellectual Property Administration (CNIPA) Translation of The First Office Action for 201910148945.0 dated Dec. 28, 2020 5 Pages.
The China National Intellectual Property Administration (CNIPA) The First Search Report for 201910148945.0 dated Dec. 14, 2020 1 Page.
The China National Intellectual Property Administration (CNIPA) The supplementary search report for 201910148945.0 dated Mar. 8, 2021 1 Page.

* cited by examiner

ENERGY STORAGE SYSTEM AND INSULATION DETECTION METHOD THEREFOR

CROSS-REFERENCE TO RELATED APPLICATIONS

This application is a United States National Stage Application filed under 35 U.S.C. § 371 of PCT Patent Application Serial No. PCT/CN 2020/076876, filed Feb. 27, 2020, which claims priority to Chinese Patent Application No. 201910148945.0, filed on Feb. 28, 2019 and entitled "ENERGY STORAGE SYSTEM AND INSULATION DETECTION METHOD THEREFOR", each of which is incorporated herein by reference in its entirety.

TECHNICAL FIELD

This application relates to the technical field of insulation detection of an energy storage system, and in particular, to an energy storage system and an insulation detection method therefor.

BACKGROUND

An energy storage station is a sophisticated industrial system, and involves a considerable amount of power equipment and electric equipment such as an energy storage battery, an inverter, and a charger. Therefore, an insulation detection system of the energy storage station is crucial to safety of energy storage station operators.

Related safety requirements are defined in some industrial standards: for an energy storage system that is not embedded in a complete circuit, if no alternating current circuit is included in the system during an entire life cycle or if the alternating current circuit is additionally protected, a value obtained by dividing an insulation resistance thereof by a maximum operating voltage thereof needs to be not less than 100 ohms/volt. If an alternating current circuit is included in the energy storage system and is not additionally protected, this value needs to be not less than 500 ohms/volt. If the energy storage system is integrated in complete industrial equipment, a higher resistance value may be required to ensure the safety of operators.

SUMMARY

In view of the foregoing, some embodiments of this application provide an energy storage system and an insulation detection method therefor to solve the problem of false reporting of faults that is likely to occur when insulation detection is performed at a PCS and a main power management system concurrently.

According to one aspect, an embodiment of this application provides an insulation detection method of an energy storage system, applicable to a main power management system in a main control cabinet of the energy storage system. The insulation detection method includes:
turning on a main positive relay and a main negative relay in a high voltage safety box of each electric cabinet in the energy storage system; controlling the insulation detection board to perform insulation detection on the energy storage system at the main power management system, and to report an insulation detection result at the main power management system to a PCS; controlling, if the insulation detection result at the main power management system indicates no fault and no instruction of starting insulation detection at the PCS is received, the insulation detection board to continue performing the insulation detection on the energy storage system at the main power management system; and instructing, if the insulation detection result at the main power management system indicates an insulation fault, a battery management system of each electric cabinet to control the main positive relay and the main negative relay in the high voltage safety box to turn off.

Optionally, the controlling the insulation detection board to perform insulation detection on the energy storage system at the main power management system includes: changing an on/off state of an insulation detection circuit by controlling status of a control switch in the insulation detection circuit in a case that a sampling voltage applied by the battery management system of the electric cabinet to the insulation detection circuit in the high voltage safety box is a high voltage; controlling, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay; calculating the insulation-to-earth value $R_p$ of the main positive relay and the insulation-to-earth value $R_n$ of the main negative relay by using an insulation sampling formula based on the plurality of voltages $U_c$ and $U_a$ sampled; and determining, according to the insulation-to-earth value $R_p$ of the main positive relay and/or the insulation-to-earth value $R_n$ of the main negative relay, whether insulation performance of the electric cabinet meets insulation requirements.

Optionally, that the insulation detection result at the main power management system indicates no fault means that the insulation performance of the energy storage system fully meets the insulation requirements.

Optionally, after the controlling the insulation detection board to perform insulation detection on the energy storage system at the main power management system, and to report an insulation detection result at the main power management system to a PCS, the method further includes: controlling, if the insulation detection result at the main power management system indicates no fault and an instruction of starting insulation detection at the PCS is received, the insulation detection board to stop performing the insulation detection on the energy storage system at the main power management system.

Optionally, the insulation detection method further includes: receiving the insulation detection result fed back by the PCS; and instructing, if the insulation detection result at the PCS indicates an insulation fault, the battery management system of each electric cabinet to control the main positive relay and the main negative relay in the high voltage safety box to turn off.

An embodiment of this application further provides an energy storage system, including: a PCS, a main control cabinet, and a plurality of electric cabinets. The main control cabinet includes a main power management system and an insulation detection board. Each electric cabinet includes a high voltage safety box. The high voltage safety box contains a main positive relay and a main negative relay. The main power management system is configured to control, after turning on the main positive relay and the main negative relay in the high voltage safety box of each electric cabinet, the insulation detection board to perform insulation detection on the energy storage system at the main power management system, and to report an insulation detection result at the main power management system to the PCS; control, if the insulation detection result at the main power management system indicates no fault and no instruction of starting insulation detection at the PCS is received, the insulation detection board to continue performing the insulation detection on the energy storage system at the main power management system; and instruct, if the insulation detection result at the main power management system indicates an insulation fault, a battery management system of each electric cabinet to control the main positive relay and the main negative relay in the high voltage safety box to turn off.

This technical solution achieves at least the following beneficial effects:

In the insulation detection method of an energy storage system according to the embodiments of this application, an insulation detection board is disposed in the main control cabinet of the energy storage system. The main power management system in the main control cabinet performs a high voltage connection process (that is, turns on the main positive relay and the main negative relay in the high voltage safety box of each electric cabinet in the energy storage system), and controls the insulation detection board to perform insulation detection on the energy storage system at the main power management system. If the insulation detection result at the main power management system indicates a fault, the main power management system reports the fault to the PCS, and instructs the battery management system of each electric cabinet to control the main positive relay and the main negative relay in the high voltage safety box to turn off (that is, performs a high voltage disconnection process). If no fault is detected in the insulation detection at the main power management system, a message of completion of high voltage connection is reported to the PCS and, if no instruction of starting insulation detection at the PCS is received, the insulation detection board is controlled to continue performing the insulation detection at the main power management system; or, if an instruction of starting insulation detection at the PCS is received, the insulation detection board is controlled to stop performing the insulation detection at the main power management system.

In the embodiments of this application, the main power management system receives the insulation detection result fed back by the PCS. If the insulation detection result at the PCS indicates an insulation fault, the battery management system of each electric cabinet is instructed to control the main positive relay and the main negative relay in the high voltage safety box to turn off. If the insulation detection result at the PCS indicates no fault, it is determined that the insulation detection on the energy storage system is free from faults. According to this technical solution, a time sequence of the insulation detection on the energy storage system at the PCS and the insulation detection at the main power management system can be scheduled to avoid mutual interference between the insulation detection at the PCS and the insulation detection at the main power management system. In addition, once a fault is detected in the insulation detection on the energy storage system at the PCS or the insulation detection at the main power management system, the main power management system performs a high voltage disconnection process, thereby improving insulation safety performance of the entire energy storage system.

DESCRIPTION OF DRAWINGS

To describe the technical solutions in the embodiments of this application more clearly, the following briefly describes the accompanying drawings required for describing the embodiments. Apparently, the accompanying drawings in the following description show merely some embodiments of this application, and a person of ordinary skill in the art may derive other drawings from these accompanying drawings without creative efforts.

REFERENCE NUMERALS

2: Energy storage system;
21: Main control cabinet;
211: Main power management system;
212: Insulation detection board;
22: Electric cabinet (including electric cabinet a, electric cabinet b, . . . , electric cabinet n);
221: Battery management system;
222: High voltage safety box;
223: Battery management unit (including BMU 01, BMU 02, . . . , BMU m);
224: Battery module;
225: Current sampling unit;
23: Power conversion system; and
51: High voltage sampling chip.

DESCRIPTION OF EMBODIMENTS

For better understanding of the technical solutions of this application, the following describes embodiments of this application in detail with reference to accompanying drawings.

Currently, the entire energy storage system generally performs insulation detection at a power conversion system (hereinafter referred to as "PCS"). First of all, the insulation detection at the PCS can be operated only after a high voltage is applied to a main power management system and a relay in the PCS is closed. If the insulation detection is not performed at the main power management system, an insulation risk may exist in a period after a high voltage is applied to the main power management system and before the PCS starts running. If the insulation detection is performed at the PCS only, mostly insulation detection at the PCS lasts a very long period that is even up to one hour. Consequently, an insulation fault may occur in the insulation detection period without being detected by the system, thereby resulting in hazards. However, if the insulation detection is performed at the main power management system additionally without clearly defining scheduling control on the insulation detection performed at the PCS and the insulation detection performed at the main power management system, false reporting of faults is likely to occur when the insulation detection is performed concurrently.

It is apparent that the described embodiments are only a part rather than entirety of the embodiments of this application. All other embodiments obtained by a person of ordinary skill in the art based on the embodiments of this application without making any creative efforts may fall within the protection scope of this application.

Figure 1:
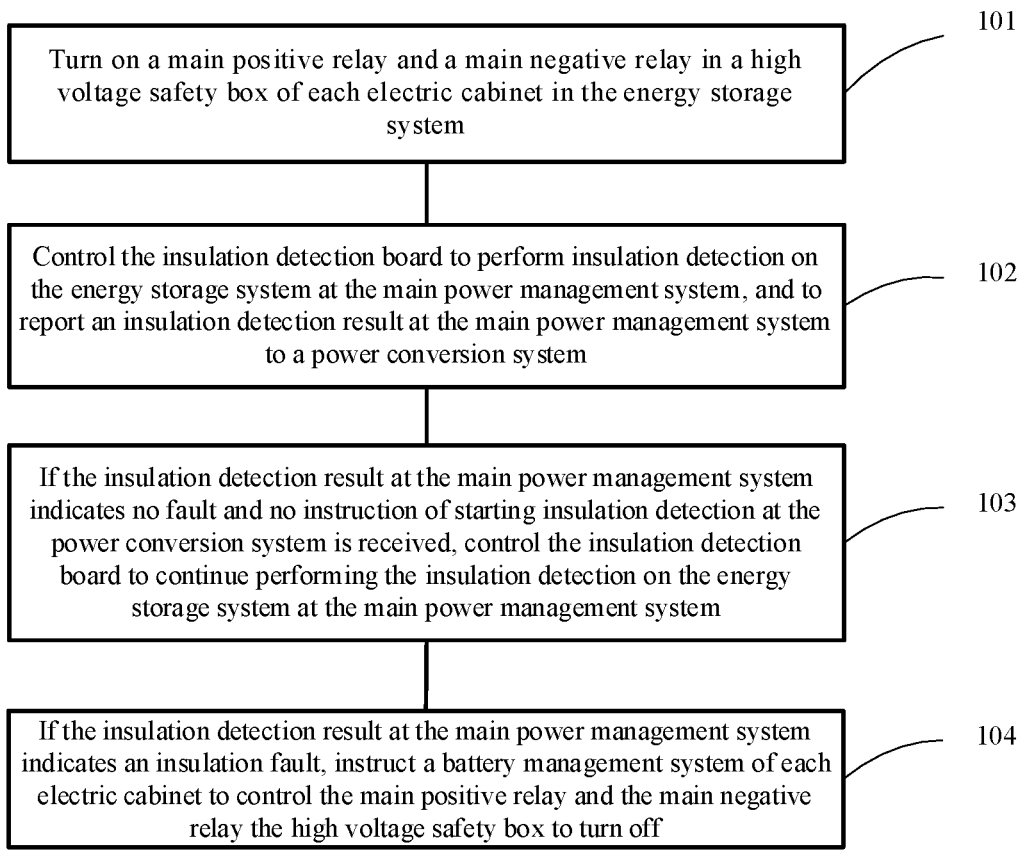
FIG. 1 is a schematic flowchart of an insulation detection method of an energy storage system according to an embodiment of this application.

FIG. 1 is a schematic flowchart of an insulation detection method of an energy storage system according to an embodiment of this application. Referring to FIG. 1, the insulation detection method includes:

Step 101: Turn on a main positive relay and a main negative relay in a high voltage safety box of each electric cabinet in the energy storage system;

Step 102: Control the insulation detection board to perform insulation detection on the energy storage system at the main power management system, and to report an insulation detection result at the main power management system to a PCS;

Step 103: If the insulation detection result at the main power management system indicates no fault and no instruction of starting insulation detection at the PCS is received, control the insulation detection board to continue performing the insulation detection on the energy storage system at the main power management system; and Step 104: If the insulation detection result at the main power management system indicates an insulation fault, instruct a battery management system of each electric cabinet to control the main positive relay and the main negative relay in the high voltage safety box to turn off.

To facilitate the understanding of the insulation detection method of the energy storage system according to an embodiment of this application, first of all, the following describes in detail an overall architecture of the energy storage system on which the insulation detection method provided in the embodiment of this application is based.

Figure 2:
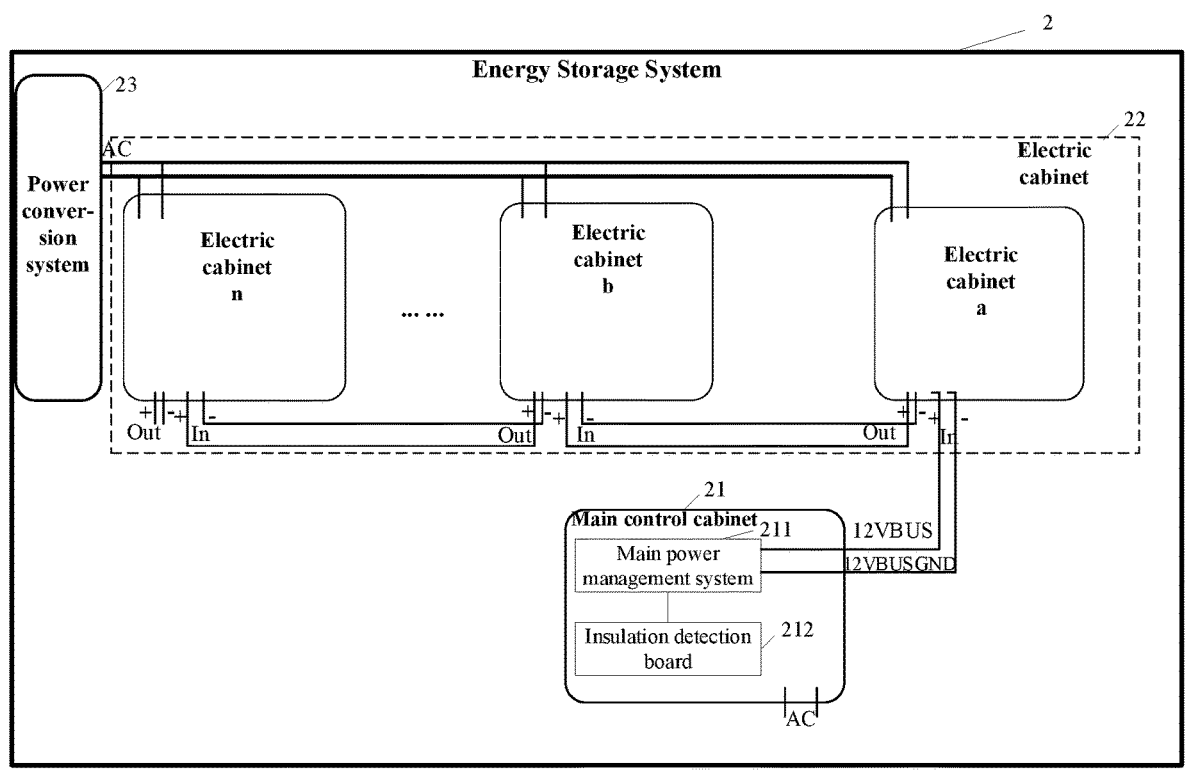
FIG. 2 is a schematic diagram of an overall architecture of an energy storage system according to an embodiment of this application.

FIG. 2 is a schematic diagram of an overall architecture of an energy storage system according to an embodiment of this application.

Referring to FIG. 2, the energy storage system 2 includes: a main control cabinet 21, several electric cabinets 22 (for example, electric cabinet a, electric cabinet b, . . . , and electric cabinet n shown in FIG. 2), and a PCS 23.

The main control cabinet 21 is a main control system of the energy storage system 2 and is configured to control all electric cabinets. The main control cabinet 21 includes a main power management system 211 and an insulation detection board 212.

In this embodiment of this application, the insulation detection board 212 is added in the main control cabinet 21 and is configured to perform insulation detection on the energy storage system 2 at the main power management system 211. A specific insulation detection process will be described in detail in an embodiment of an insulation detection method below.

The electric cabinets 22 are connected in parallel. Depending on a quantity of battery modules connected in each electric cabinet 22, the electric cabinet 22 can output a high voltage of 300 V~1,000 V. The high voltages that are output by all electric cabinets are connected in parallel to form a high voltage direct-current system, and then converted by the PCS 23 into high voltage alternating-current power source available being output to external devices. The PCS 23 communicates with the main power management system 211 through a controller area network (CAN) bus (not shown in FIG. 2).

Figure 3:
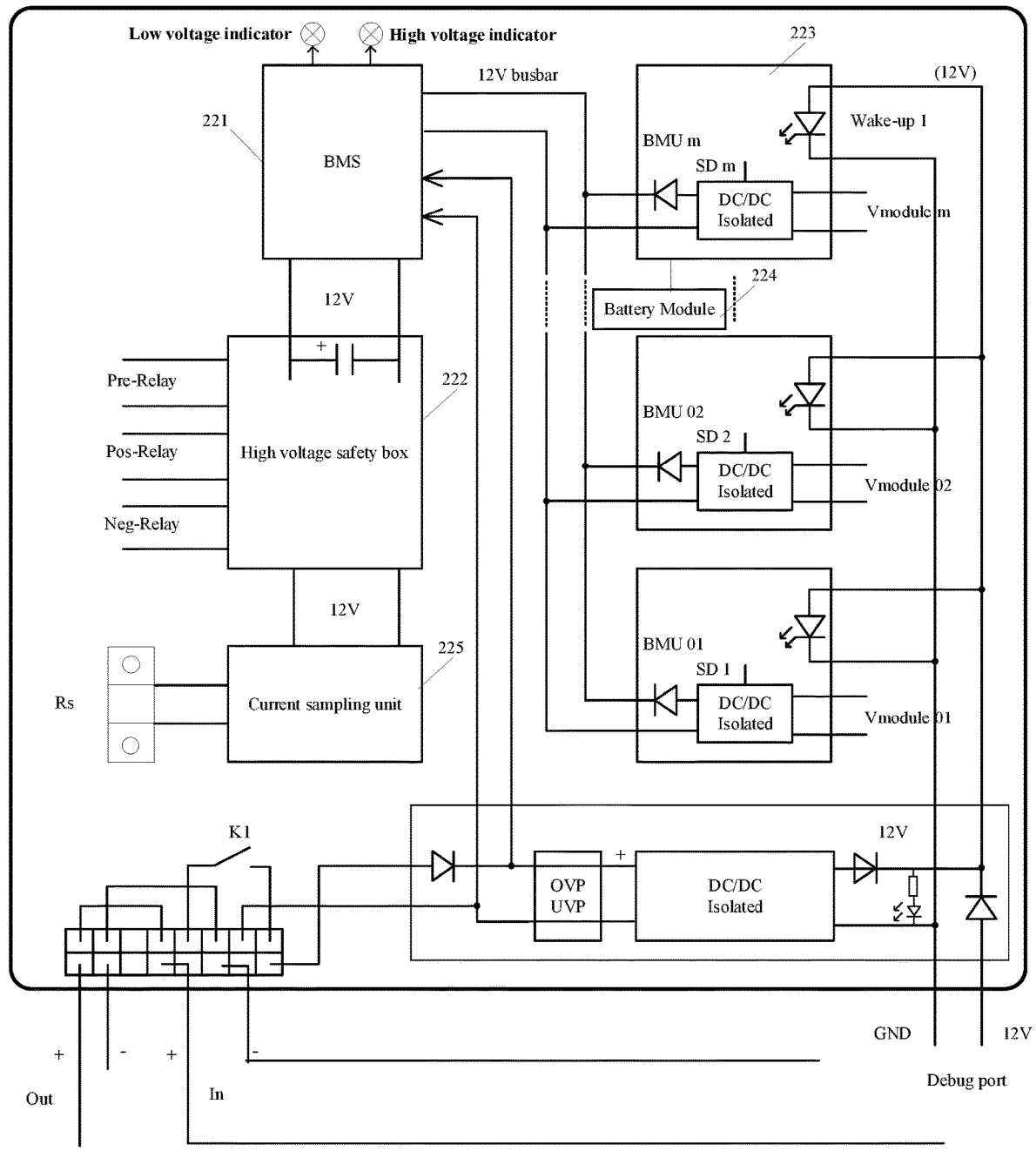
FIG. 3 is a schematic structural diagram of a single electric cabinet in an energy storage system shown in FIG. 2.

FIG. 3 is a schematic structural diagram of a single electric cabinet in an energy storage system shown in FIG. 2.

Referring to FIG. 3, in this embodiment, all electric cabinets (such as electric cabinet a, electric cabinet b, . . . , and electric cabinet n shown in FIG. 2) in the energy storage system 2 have the same structure. Therefore, in FIG. 3, the electric cabinet a shown in FIG. 2 is used as an example.

In an embodiment, the electric cabinet a includes a battery management system 221, a high voltage safety box 222, and a plurality of battery management units (BMUs) 223 (such as BMU 01, BMU 02, . . . , BMU m shown in FIG. 3), a battery module 224, and a current sampling unit 225. The current sampling unit 225 is configured to collect a current of a battery cell. The collected current of the battery cell is transmitted to the battery management system 221 through the CAN bus.

Referring to FIG. 2 and FIG. 3, the main power management system 211 is a top-level architecture of the battery management system that adopts a three-level architecture in the energy storage system 2. The main power management system 211 is configured to control the battery management system (level-2 architecture) in each electric cabinet 22. The battery management system in each electric cabinet 22 controls a plurality of BMUs (level-3 architecture).

The high voltage safety box 222 includes three relays: a precharge relay (Pre-Relay), a main positive relay (Pos-Relay), and a main negative relay (Neg-Relay). The battery module 224 outputs electric energy (is discharged) or receives external electric energy (is charged) through the three relays.

The main power management system 211 in the main control cabinet 21 communicates with the battery management system 221 in each electric cabinet through the CAN bus; the main power management system 211 communicates with the high voltage safety box in each electric cabinet through the CAN bus; and the battery management system 221 in a single electric cabinet communicates with the plurality of BMUs 223 also through the CAN bus.

The following describes the insulation detection method shown in FIG. 1 based on the overall architecture of the energy storage system shown in FIG. 2, and based on a structure of a single electric cabinet in the energy storage system shown in FIG. 3.

The insulation detection method according to this embodiment is applicable to the main power management system in the main control cabinet of the energy storage system. That is, the main power management system controls an insulation detection process for the energy storage system.

Specifically, as mentioned in step 101, the main positive relay and the main negative relay in the high voltage safety box of each electric cabinet in the energy storage system are turned on.

Referring to FIG. 2 and FIG. 3, the main power management system 211 controls, through the CAN bus, the main positive relay and the main negative relay in the high voltage safety box 222 in the electric cabinet a to turn on, and a sampling voltage applied by the battery management system 221 to the insulation detection circuit in the high voltage safety box 222 is high voltage.

As mentioned in step 102, the insulation detection board is controlled to perform insulation detection on the energy storage system at the main power management system, and to report an insulation detection result at the main power management system to a PCS.

In this embodiment, an insulation detection board 212 is disposed in the main electric cabinet 21, and the insulation detection is performed on the energy storage system 2 at the main power management system 211. In a specific implementation process, the insulation detection is performed on each electric cabinet in the energy storage system, so as to complete the insulation inspection on the energy storage system at the main power management system 211.

In an embodiment, step S102 includes:

Step 1021: Change an on/off state of the insulation detection circuit by controlling status of a switch in the insulation detection circuit in a case that the sampling voltage applied by the battery management system of the electric cabinet to the insulation detection circuit in the high voltage safety box is a high voltage;

Step 1022: Control, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay;

Step 1023: Calculate the insulation-to-earth value $R_p$ of the main positive relay and the insulation-to-earth value $R_n$ of the main negative relay by using an insulation sampling formula based on the plurality of voltages $U_c$ and $U_a$ sampled; and Step 1024: Determine, according to the insulation-to-earth value $R_p$ of the main positive relay and/or the insulation-to-earth value $R_n$ of the main negative relay, whether insulation performance of the electric cabinet meets insulation requirements.

It needs to be noted that in practical applications, criteria for determining whether the insulation performance of the electric cabinet meets the insulation requirements vary between different energy storage systems. Therefore, this embodiment does not limit the criteria for determining whether the insulation requirements are met. A person skilled in the art understands that for an energy storage system that is not embedded in a complete circuit, if no alternating current circuit is included in the system during an entire life cycle or if the alternating current circuit is additionally protected, a value obtained by dividing an insulation resistance thereof by a maximum operating voltage thereof needs to be not less than 100 ohms/volt. If an alternating current circuit is included in the energy storage system and is not additionally protected, this value needs to be not less than 500 ohms/volt. If the energy storage system is integrated in complete industrial equipment, a higher resistance value may be required to ensure the safety of operators.

The following describes a process of the insulation detection at the main power management system with reference to a specific instance.

Figure 4:
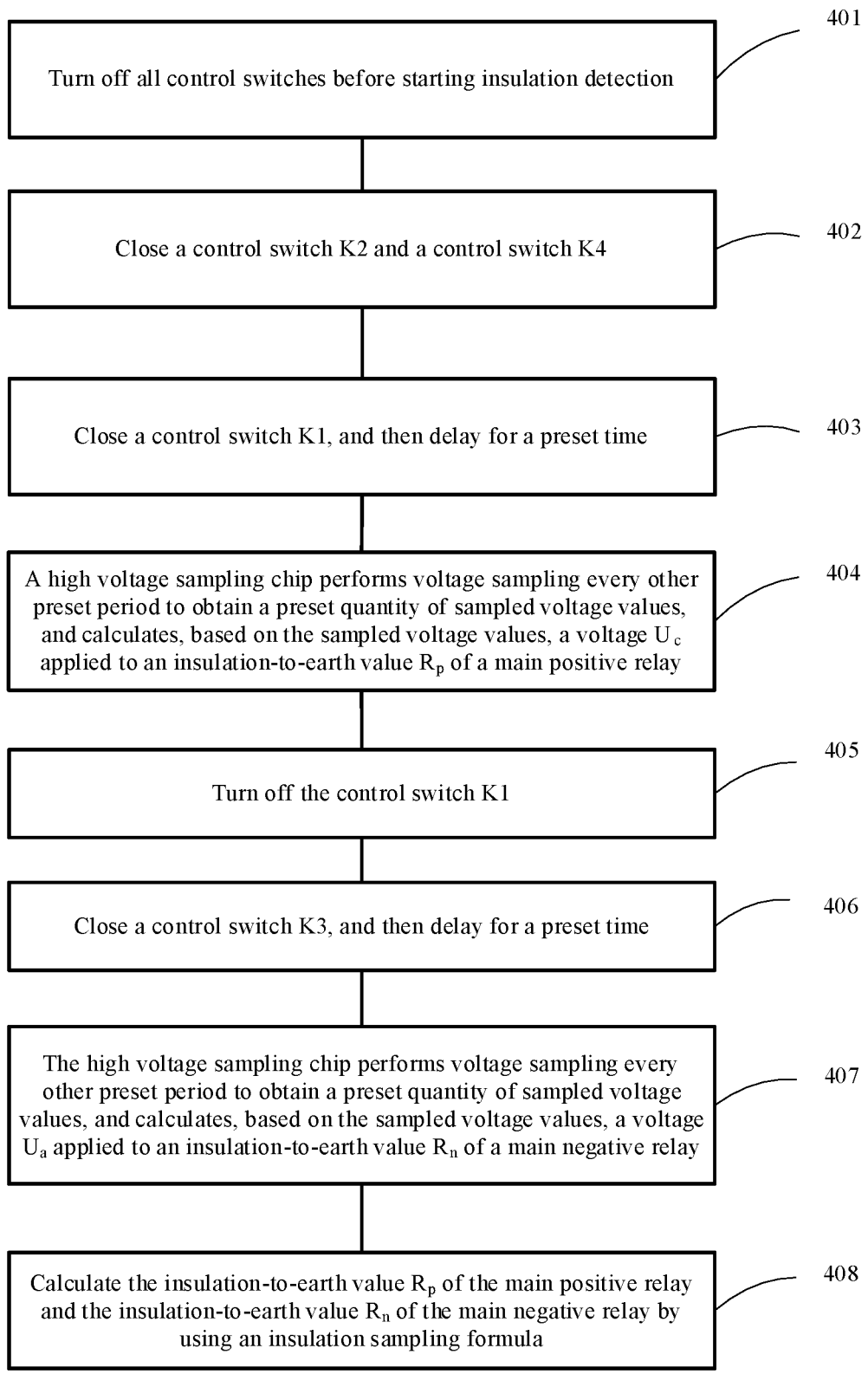
FIG. 4 is a schematic flowchart of a specific instance of performing insulation detection at a main power management system in an insulation detection method of an energy storage system according to an embodiment of this application.

FIG. 4 is a schematic flowchart of a specific instance of performing insulation detection at a main power management system in an insulation detection method of an energy storage system according to an embodiment of this application.

Figure 5A:
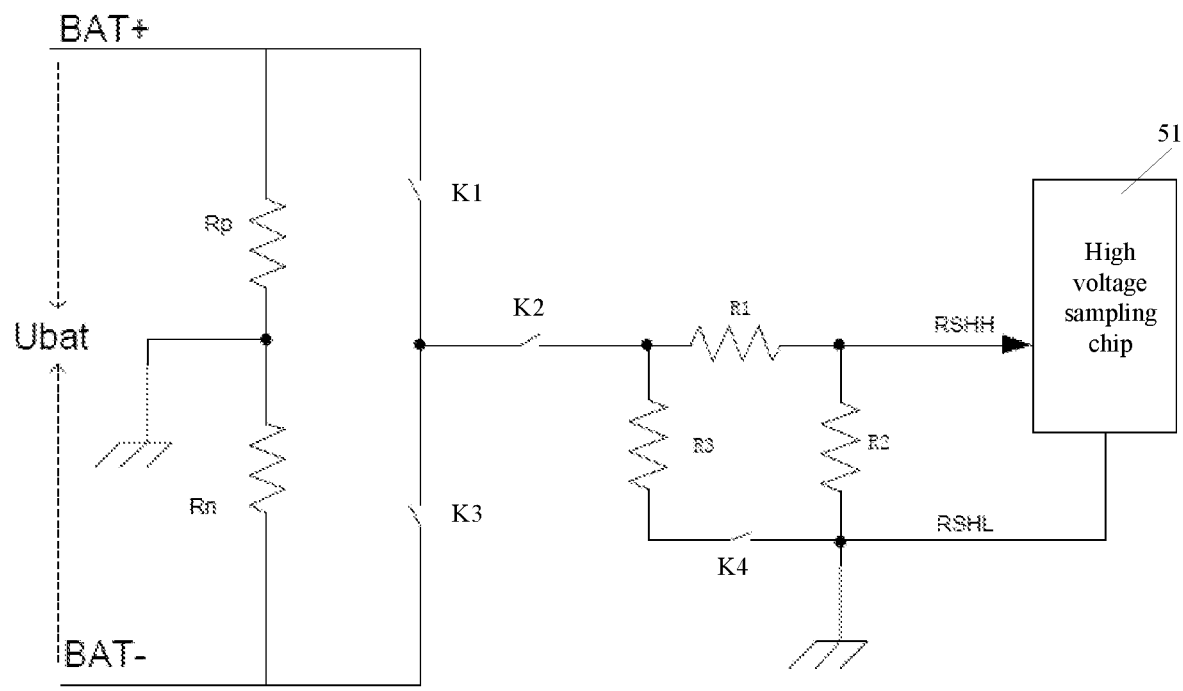
FIG. 5a is a schematic structural diagram of an insulation detection circuit used in the specific instance shown in FIG. 4.

FIG. 5a is a schematic structural diagram of an insulation detection circuit used in the specific instance shown in FIG. 4.

Figure 5B:
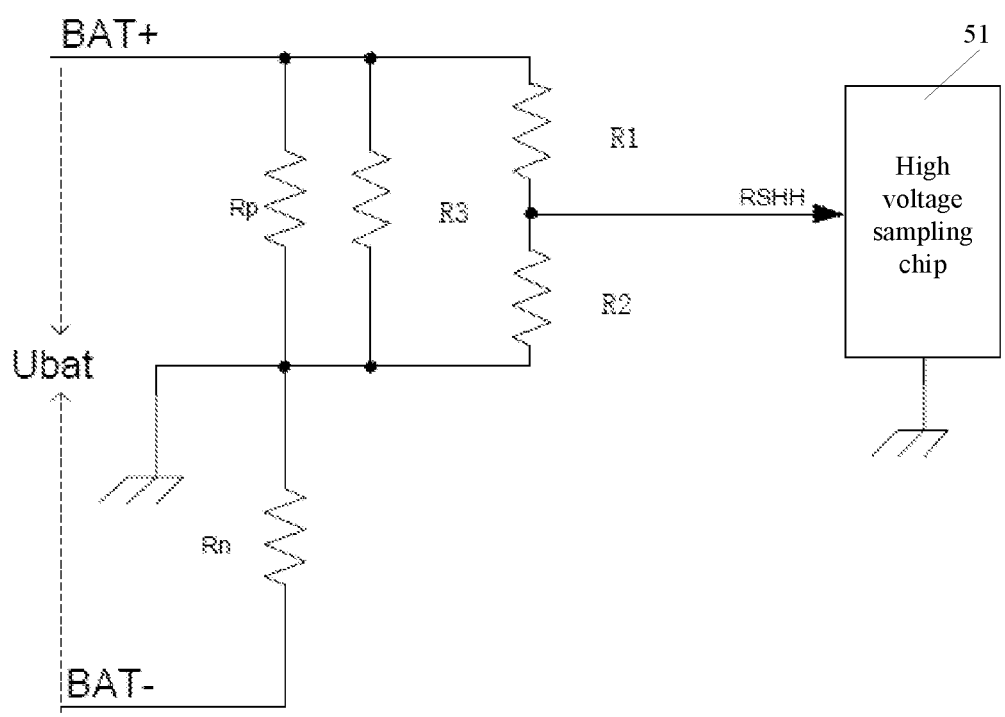
FIG. 5b is a schematic structural diagram of an insulation detection circuit for detecting a voltage $U_c$ applied to an insulation-to-earth value $R_p$ of a main positive relay according to an embodiment of this application.

FIG. 5b is a schematic structural diagram of an insulation detection circuit for detecting a voltage $U_c$ applied to an insulation-to-earth value $R_p$ of a main positive relay according to an embodiment of this application.

Figure 5C:
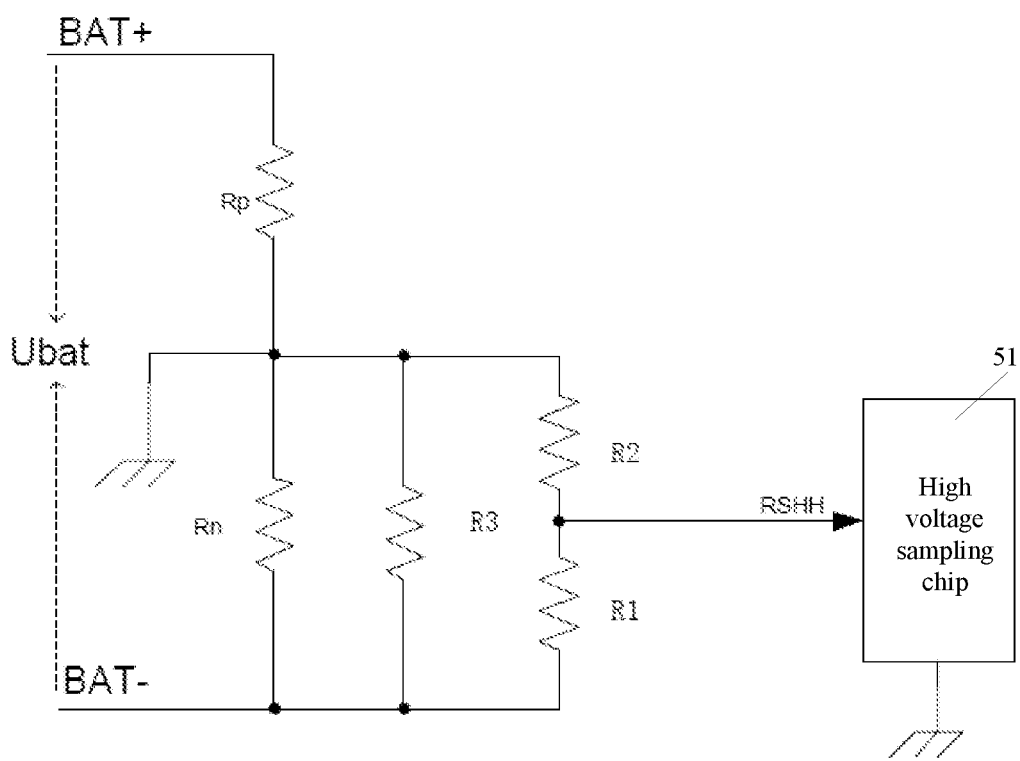
FIG. 5c is a schematic structural diagram of an insulation detection circuit for detecting a voltage $U_a$ applied to an insulation-to-earth value $R_n$ of a main negative relay according to an embodiment of this application.

FIG. 5c is a schematic structural diagram of an insulation detection circuit for detecting a voltage $U_a$ applied to an insulation-to-earth value $R_n$ of a main negative relay according to an embodiment of this application.

Referring to FIG. 4, the insulation detection at the main power management system includes:

Step 401: Turn off all control switches before starting insulation detection.

With reference to FIG. 5a, the insulation detection starts in a case that a battery management system of an electric cabinet applies a high voltage Ubat to an insulation detection circuit in a high voltage safety box. Before the insulation detection starts, all control switches are turned off. The control switches include: a control switch K2, a control switch K4, a control switch K1, and a control switch K3.

Step 402: Close the control switch K2 and the control switch K4.

Step 403: Close the control switch K1, and then delay for a preset period.

The preset period may be set according to a time required for obtaining a sampled voltage value subsequently. For example, the preset period is set to 4 seconds.

FIG. 5b shows the insulation detection circuit after the control switch K2, the control switch K4, and the control switch K1 in the insulation detection circuit shown in FIG. 5a are closed.

Step 404: A high voltage sampling chip 51 performs voltage sampling every other preset period to obtain a preset quantity of sampled voltage values, and calculates, based on the sampled voltage values, a voltage $U_c$ applied to an insulation-to-earth value $R_p$ of a main positive relay.

For example, the preset period is 10 milliseconds, and the preset quantity is 12. 12 sampled voltage values are obtained within 120 milliseconds. In order to reduce a sampling error, a maximum sampled voltage value and a minimum sampled voltage value may be removed, and remaining 10 sampled voltage values may be averaged out to obtain the voltage $U_c$ applied to the insulation-to-earth value $R_p$ of the main positive relay.

Step 405: Turn off the control switch K1.

Step 406: Close the control switch K3, and then delay for a preset period.

The preset period may be set according to a time required for obtaining a sampled voltage value subsequently. For example, the preset period is set to 4 seconds.

FIG. 5c shows the insulation detection circuit after the control switch K1 and the control switch K3 are closed on the basis of the insulation detection circuit shown in FIG. 5b and the insulation detection circuit shown in FIG. 5a.

Step 407: The high voltage sampling chip 51 performs voltage sampling every other preset period to obtain a preset quantity of sampled voltage values, and calculates, based on the sampled voltage values, a voltage $U_a$ applied to an insulation-to-earth value $R_n$ of a main negative relay.

Similar to step 404 above, in this step, the preset period is 10 milliseconds, and the preset quantity is 12. 12 sampled voltage values are obtained within 120 milliseconds. In order to reduce a sampling error, a maximum sampled voltage value and a minimum sampled voltage value may be removed, and remaining 10 sampled voltage values may be averaged out to obtain the voltage $U_a$ applied to the insulation-to-earth value $R_n$ of the main negative relay.

Step 408: Calculate the insulation-to-earth value $R_p$ of the main positive relay and the insulation-to-earth value $R_n$ of the main negative relay by using an insulation sampling formula.

In this embodiment, the insulation sampling formula is as follows:

$$R_p = \frac{||U_{bat}| - |U_a| - |U_c|| \times (R_1 + R_2) \times R_3 / (R_1 + R_2 + R_3)}{|U_a|}$$

$$R_n = \frac{||U_{bat}| - |U_a| - |U_c|| \times (R_1 + R_2) \times R_3 / (R_1 + R_2 + R_3)}{|U_c|}$$

where, $R_1$, $R_2$, and $R_3$ are known resistances, and their specific resistance values may be set according to the actual insulation detection circuit. For example, $R_1$=3.6 megohms, $R_2$=360 ohms, and $R_3$=1.5 megohms.

Subsequently, according to the insulation-to-earth value $R_p$ of the main positive relay and/or the insulation-to-earth value $R_n$ of the main negative relay, it is determined whether insulation performance of the electric cabinet meets insulation requirements.

It needs to be noted that this specific instance is only an embodiment in which an insulation detection board is used to perform insulation detection on the energy storage system at the main power management system, and is not a limitation on this application. A person skilled in the art may also perform insulation detection on the energy storage system at the main power management system based on structures of other insulation detection circuits.

After insulation detection is performed on each electric cabinet in the energy storage system by using the insulation detection circuit, if the insulation performance of each electric cabinet meets the insulation requirements, it is determined that a detection result for the energy storage system at the main power management system indicates no fault. Each electric cabinet has the same insulation-to-earth value $R_p$ of the main positive relay and the same insulation-to-earth value $R_n$ of the main negative relay. Therefore, if the insulation performance of one of the electric cabinets does not meet the insulation requirements, the insulation performance of all electric cabinets fails to meet the insulation requirements, and it is thus determined that the detection result at the main power management system indicates an insulation fault. The main power management system reports the insulation detection result at the main power management system to a PCS.

As mentioned in step 103, if the insulation detection result at the main power management system indicates no fault and no instruction of starting insulation detection at the PCS is received, control the insulation detection board to continue performing the insulation detection on the energy storage system at the main power management system.

A period of insulation detection on the energy storage system at the main power management system is relatively short. Therefore, when the PCS does not start insulation detection, insulation detection can be performed on the energy storage system at the main power management system in real time.

Conversely, if the insulation detection result at the main power management system indicates no fault and an instruction of starting insulation detection at the PCS is received, the insulation detection board is controlled to stop performing the insulation detection on the energy storage system at the main power management system. In this case, the insulation detection is performed on the energy storage system at the PCS, and generally the PCS may use its own insulation monitoring module to perform insulation detection on the energy storage system. The process of performing insulation detection on the energy storage system at the PCS may be based on existing technologies, and is omitted here.

As mentioned in step 104, if the insulation detection result at the main power management system indicates an insulation fault, a battery management system of each electric cabinet is instructed to control the main positive relay and the main negative relay in the high voltage safety box to turn off.

When the insulation detection result at the main power management system indicates an insulation fault, the main power management system performs a high voltage disconnection process to ensure insulation safety of the energy storage system. Specifically, the main power management system instructs the battery management system of each electric cabinet to control the main positive relay and the main negative relay in the high voltage safety box to turn off.

For example, the insulation detection method according to this embodiment further includes the following steps:

receiving the insulation detection result fed back by the PCS; and instructing, if the insulation detection result at the PCS indicates an insulation fault, the battery management system of each electric cabinet to control the main positive relay and the main negative relay in the high voltage safety box to turn off.

In other words, in the case that the insulation detection result of the insulation detection performed on the energy storage system at the main power management system indicates no fault, if the insulation detection result at the PCS indicates an insulation fault, the entire energy storage system is still at risk of insulation faults. Therefore, the PCS communicates with the main power management system through the CAN bus to inform that the insulation detection result indicates an insulation fault. The main power management system instructs the battery management system of each electric cabinet to control the main positive relay and the main negative relay in the high voltage safety box to turn off (that is, performs a high voltage disconnection process).

Evidently, scheduling control exercised on the insulation detection at the PCS and the insulation detection at the main power management system in the way above can effectively avoid false reporting of faults that is likely to occur when the insulation detection is performed on the energy storage system at the PCS and the main power management system concurrently.

An embodiment of this application further provides an energy storage system. The energy storage system includes a PCS, a main control cabinet, and a plurality of electric cabinets. The main control cabinet includes a main power management system and an insulation detection board. Each electric cabinet includes a high voltage safety box. The high voltage safety box contains a main positive relay and a main negative relay.

The main power management system is configured to:

control, after turning on the main positive relay and the main negative relay in the high voltage safety box of each electric cabinet, the insulation detection board to perform insulation detection on the energy storage system at the main power management system, and to report an insulation detection result at the main power management system to the PCS;

control, if the insulation detection result at the main power management system indicates no fault and no instruction of starting insulation detection at the PCS is received, the insulation detection board to continue performing the insulation detection on the energy storage system at the main power management system; and instruct, if the insulation detection result at the main power management system indicates an insulation fault, a battery management system of each electric cabinet to control the main positive relay and the main negative relay in the high voltage safety box to turn off.

In an embodiment, the main power management system is further configured to: change an on/off state of an insulation detection circuit by controlling status of a switch in the insulation detection circuit in a case that a sampling voltage applied by the battery management system of the electric cabinet to the insulation detection circuit in the high voltage safety box is a high voltage; control, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay; calculate the insulation-to-earth value $R_p$ of the main positive relay and the insulation-to-earth value $R_n$ of the main negative relay by using an insulation sampling formula based on the plurality of voltages $U_c$ and $U_a$ sampled; and determine, according to the insulation-to-earth value $R_p$ of the main positive relay and/or the insulation-to-earth value $R_n$ of the main negative relay, whether insulation performance of the electric cabinet meets insulation requirements.

That the insulation detection result at the main power management system indicates no fault means that the insulation performance of the energy storage system fully meets the insulation requirements.

In an embodiment, the main power management system is further configured to: control, if the insulation detection result at the main power management system shows no fault and an instruction of starting insulation detection at the PCS is received, the insulation detection board to stop performing the insulation detection on the energy storage system at the main power management system.

In an embodiment, the main power management system is further configured to: receive the insulation detection result fed back by the PCS; and instruct, if the insulation detection result at the PCS indicates an insulation fault, the battery management system of each electric cabinet to control the main positive relay and the main negative relay in the high voltage safety box to turn off.

The specific structure of the energy storage system according to this embodiment may be learned by referring to the embodiments shown in FIG. 2 and FIG. 3 above, and the specific process of insulation detection performed at the main power management system in the main electric cabinet of the energy storage system may be learned by referring to the embodiment shown in FIG. 1 above, and no repeated description is given herein any more.

The terms used in the embodiments of this application are intended only for describing specific embodiments rather than for limiting this application. Unless otherwise expressly indicated in the context, the words "a", "the", and "this" that precedes a singular noun in the embodiments and claims of this application are intended to include the plural form of the noun.

Understandably, the term "and/or" used herein only describes an association relationship between associated objects and indicates existence of three relationships. For example, "A and/or B" may indicate existence of A alone, coexistence of A and B, and existence of B alone. In addition, the character "/" herein generally indicates an "or" relationship between the object preceding the character and the object following the character.

A person of ordinary skill in the art understands that the embodiments described above are exemplary embodiments for implementing this application. In practical applications, various modifications may be made in form and detail to the embodiments without departing from the spirit and scope of this application.

What is claimed is:

1. An insulation detection method of an energy storage system, comprising:
   turning on a main positive relay and a main negative relay in a high voltage safety box of each electric cabinet in the energy storage system;
   controlling an insulation detection board in a main control cabinet of the energy storage system to:
     perform insulation detection on the energy storage system at a main power management system in the main control cabinet, and
     report an insulation detection result at the main power management system to a power conversion system configured to convert a direct-current voltage from the electric cabinet into an alternating-current voltage;
   controlling, in response to that the insulation detection result at the main power management system indicates no fault and no instruction of starting insulation detection at the power conversion system is received, the insulation detection board to continue performing the insulation detection on the energy storage system at the main power management system; and
   instructing, in response to that the insulation detection result at the main power management system indicates an insulation fault, a battery management system of each electric cabinet to control the main positive relay and the main negative relay in the high voltage safety box to turn off.

2. The insulation detection method according to claim 1, wherein the controlling the insulation detection board to perform insulation detection on the energy storage system at the main power management system comprises:
   changing an on/off state of an insulation detection circuit by controlling status of a control switch in the insulation detection circuit in response to that a sampling voltage applied by the battery management system of the electric cabinet to the insulation detection circuit in the high voltage safety box is a high voltage;
   controlling, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay;
   performing calculation to obtain the insulation-to-earth value $R_p$ of the main positive relay and the insulation-to-earth value $R_n$ of the main negative relay by using an insulation sampling formula based on the plurality of voltages $U_c$ and $U_a$ sampled; and
   determining, according to the insulation-to-earth value $R_p$ of the main positive relay and/or the insulation-to-earth value $R_n$ of the main negative relay, whether insulation performance of the electric cabinet meets insulation requirements.

3. The insulation detection method according to claim 2, wherein that the insulation detection result at the main power management system indicates no fault means that the insulation performance of the energy storage system fully meets the insulation requirements.

4. The insulation detection method according to claim 1, wherein after the controlling the insulation detection board to perform insulation detection on the energy storage system at the main power management system, and to report the insulation detection result at the main power management system to the power conversion system, the method further comprises:
controlling, in response to that the insulation detection result at the main power management system indicates no fault and an instruction of starting insulation detection at the power conversion system is received, the insulation detection board to stop performing the insulation detection on the energy storage system at the main power management system.

5. The insulation detection method according to claim 1, further comprising:
receiving an insulation detection result fed back by the power conversion system; and
instructing, in response to that the insulation detection result at the power conversion system indicates an insulation fault, the battery management system of each electric cabinet to control the main positive relay and the main negative relay in the high voltage safety box to turn off.

6. An energy storage system, comprising: a power conversion system, a main control cabinet, and a plurality of electric cabinets electrically connected to each other, wherein the main control cabinet comprises a main power management system and an insulation detection board, each electric cabinet comprises a high voltage safety box, and the high voltage safety box comprises a main positive relay and a main negative relay; wherein the main power management system is configured to
control, after turning on the main positive relay and the main negative relay in the high voltage safety box of each electric cabinet, the insulation detection board to:
perform insulation detection on the energy storage system at the main power management system, and report an insulation detection result at the main power management system to the power conversion system configured to convert a direct-current voltage from the electric cabinets into an alternating-current voltage;
control, in response to that the insulation detection result at the main power management system indicates no fault and no instruction of starting insulation detection at the power conversion system is received, the insulation detection board to continue performing the insulation detection on the energy storage system at the main power management system; and
instruct, in response to that the insulation detection result at the main power management system indicates an insulation fault, a battery management system of each electric cabinet to control the main positive relay and the main negative relay in the high voltage safety box to turn off.

7. The energy storage system according to claim 6, wherein the main power management system is further configured to:
change an on/off state of an insulation detection circuit by controlling status of a switch in the insulation detection circuit in response to that a sampling voltage applied by the battery management system of the electric cabinet to the insulation detection circuit in the high voltage safety box is a high voltage;
control, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay;
perform calculation to obtain the insulation-to-earth value $R_p$ of the main positive relay and the insulation-to-earth value $R_n$ of the main negative relay by using an insulation sampling formula based on the plurality of voltages $U_c$ and $U_a$ sampled; and
determine, according to the insulation-to-earth value $R_p$ of the main positive relay and/or the insulation-to-earth value $R_n$ of the main negative relay, whether insulation performance of the electric cabinet meets insulation requirements.

8. The energy storage system according to claim 7, wherein that the insulation detection result at the main power management system indicates no fault means that the insulation performance of the energy storage system fully meets the insulation requirements.

9. The energy storage system according to claim 6, wherein the main power management system is further configured to control, in response to that the insulation detection result at the main power management system indicates no fault and an instruction of starting insulation detection at the power conversion system is received, the insulation detection board to stop performing the insulation detection on the energy storage system at the main power management system.

10. The energy storage system according to claim 6, wherein the main power management system is further configured to:
receive an insulation detection result fed back by the power conversion system; and
instruct, in response to that the insulation detection result at the power conversion system indicates an insulation fault, the battery management system of each electric cabinet to control the main positive relay and the main negative relay in the high voltage safety box to turn off.

11. An insulation detection method of an energy storage system, comprising:
turning on a main positive relay and a main negative relay in a high voltage safety box of each electric cabinet in the energy storage system;
controlling an insulation detection board in a main control cabinet of the energy storage system to:
perform insulation detection on the energy storage system at a main power management system in the main control cabinet, comprising:
changing an on/off state of an insulation detection circuit by controlling status of a control switch in the insulation detection circuit in a case response to that a sampling voltage applied by the battery management system of the electric cabinet to the insulation detection circuit in the high voltage safety box is a high voltage;
controlling, in different on/off states of the insulation detection circuit, a high voltage sampling chip of the insulation detection circuit to sample a plurality of voltages $U_c$ applied to an insulation-to-earth value $R_p$ of the main positive relay and a plurality of voltages $U_a$ applied to an insulation-to-earth value $R_n$ of the main negative relay;

performing calculation to obtain the insulation-to-earth value $R_p$ of the main positive relay and the insulation-to-earth value $R_n$ of the main negative relay by using an insulation sampling formula based on the plurality of voltages $U_c$ and $U_a$ sampled; and determining, according to the insulation-to-earth value $R_p$ of the main positive relay and/or the insulation-to-earth value $R_n$ of the main negative relay, whether insulation performance of the electric cabinet meets insulation requirements; and report an insulation detection result at the main power management system to a power conversion system;

controlling, in response to that the insulation detection result at the main power management system indicates no fault and no instruction of starting insulation detection at the power conversion system is received, the insulation detection board to continue performing the insulation detection on the energy storage system at the main power management system; and instructing, in response to that the insulation detection result at the main power management system indicates an insulation fault, a battery management system of each electric cabinet to control the main positive relay and the main negative relay in the high voltage safety box to turn off.

\* \* \* \* \*